(12) United States Patent
Neufeld

(10) Patent No.: US 11,678,433 B2
(45) Date of Patent: Jun. 13, 2023

(54) PRINTED CIRCUIT BOARD ASSEMBLY FOR EDGE-COUPLING TO AN INTEGRATED CIRCUIT

(71) Applicant: D-WAVE SYSTEMS INC., Burnaby (CA)

(72) Inventor: Richard D. Neufeld, Burnaby (CA)

(73) Assignee: D-WAVE SYSTEMS INC., Burnaby (CA)

( * ) Notice: Subject to any disclaimer, the term of this patent is extended or adjusted under 35 U.S.C. 154(b) by 391 days.

(21) Appl. No.: 16/560,517

(22) Filed: Sep. 4, 2019

(65) Prior Publication Data

US 2020/0084882 A1    Mar. 12, 2020

Related U.S. Application Data

(60) Provisional application No. 62/727,819, filed on Sep. 6, 2018.

(51) Int. Cl.
*H05K 7/06* (2006.01)
*B23P 19/00* (2006.01)
(Continued)

(52) U.S. Cl.
CPC ........... *H05K 1/0243* (2013.01); *H01L 39/04* (2013.01); *H01R 24/50* (2013.01); *H01R 25/006* (2013.01);
(Continued)

(58) Field of Classification Search
CPC ....... H05K 2201/09809; H05K 1/0243; H05K 1/09; H05K 1/144; H05K 2203/166;
(Continued)

(56) References Cited

U.S. PATENT DOCUMENTS 3,343,979 A    9/1967    Hamrin
3,859,149 A    1/1975    Kay
(Continued)

FOREIGN PATENT DOCUMENTS

CN    85101736 A    1/1987
CN    1140008 A    1/1997
(Continued)

OTHER PUBLICATIONS

Chinese Office Action dated Jan. 5, 2022 for Chinese Application No. 201780076119.9 in 10 pages (translation of action).
(Continued)

*Primary Examiner* — Paul D Kim
(74) *Attorney, Agent, or Firm* — Cozen O'Connor

(57) ABSTRACT

Systems, methods, and devices for electrically coupling an integrated circuit to a set of coaxial lines via a printed circuit board assembly are described. A device sample holder includes a printed circuit board that is operable to edge-couple to an integrated circuit. A surface of the printed circuit board that carries a set of coaxial connectors is orthogonal to another surface of the printed circuit board that exposes a set of conductive traces. The set of conductive traces are operable to electrically couple to a set of conductive paths of an integrated circuit to provide a communicative path between the integrated circuit and components of an input/output system in a refrigerated environment.

8 Claims, 10 Drawing Sheets

(51) Int. Cl.
  *H05K 1/02* (2006.01)
  *H05K 1/09* (2006.01)
  *H05K 1/14* (2006.01)
  *H05K 3/30* (2006.01)
  *H01R 24/50* (2011.01)
  *H01R 25/00* (2006.01)
  *H01L 39/04* (2006.01)
  *H01R 103/00* (2006.01)

(52) U.S. Cl.
  CPC ............. *H05K 1/0266* (2013.01); *H05K 1/09* (2013.01); *H05K 1/144* (2013.01); *H05K 3/301* (2013.01); *H01R 2103/00* (2013.01); *H05K 2201/09809* (2013.01); *H05K 2201/10446* (2013.01); *H05K 2203/166* (2013.01)

(58) Field of Classification Search
  CPC .... H05K 3/301; H01R 2103/00; H01R 24/50; H01R 25/006
  See application file for complete search history.

(56) References Cited

U.S. PATENT DOCUMENTS

| | | |
|---|---|---|
| 4,141,850 A | 2/1979 | Readio et al. |
| 4,144,119 A | 3/1979 | Dutkewych et al. |
| 4,437,931 A | 3/1984 | Elias et al. |
| 4,466,859 A | 8/1984 | Nelson |
| 4,632,727 A | 12/1986 | Nelson |
| 4,660,061 A | 4/1987 | Sweeny et al. |
| 4,849,124 A | 7/1989 | Backus |
| 4,915,781 A | 4/1990 | Bohnen et al. |
| 4,954,480 A | 9/1990 | Imanaka et al. |
| 4,956,035 A | 9/1990 | Sedlak |
| 5,106,454 A | 4/1992 | Allardyce et al. |
| 5,430,012 A | 7/1995 | Nakamura et al. |
| 5,440,239 A | 8/1995 | Zappella et al. |
| 5,492,595 A | 2/1996 | Carano et al. |
| 5,532,094 A | 7/1996 | Arimura et al. |
| 5,538,152 A | 7/1996 | Fontana |
| 5,800,859 A | 9/1998 | Price et al. |
| 6,086,779 A | 7/2000 | Bishop et al. |
| 6,184,477 B1 | 2/2001 | Tanahashi |
| 6,444,140 B2 | 9/2002 | Schemenaur et al. |
| 6,678,540 B2 | 1/2004 | Wire et al. |
| 6,746,621 B2 | 6/2004 | Kurii et al. |
| 6,747,217 B1 | 6/2004 | Jochym et al. |
| 6,852,926 B2 | 2/2005 | Ma et al. |
| 7,135,701 B2 | 11/2006 | Amin et al. |
| 7,148,483 B1 | 12/2006 | Testardi |
| 7,533,068 B2 | 5/2009 | Maassen Van Den Brink et al. |
| 7,687,938 B2 | 3/2010 | Bunyk et al. |
| 7,800,395 B2 | 9/2010 | Johnson et al. |
| 7,898,282 B2 | 3/2011 | Harris et al. |
| 7,932,515 B2 | 4/2011 | Bunyk |
| 8,008,942 B2 | 8/2011 | Van Den Brink et al. |
| 8,018,244 B2 | 9/2011 | Berkley |
| 8,190,548 B2 | 5/2012 | Choi |
| 8,195,596 B2 | 6/2012 | Rose et al. |
| 8,315,678 B2 | 11/2012 | Uchaykin |
| 8,421,053 B2 | 4/2013 | Bunyk et al. |
| 8,441,329 B2 | 5/2013 | Thom et al. |
| 8,481,472 B2 | 7/2013 | Westwood et al. |
| 8,649,834 B1 | 2/2014 | Jones |
| 8,772,759 B2 | 7/2014 | Bunyk et al. |
| 9,175,404 B2 | 11/2015 | Kojima et al. |
| 2006/0147154 A1 | 7/2006 | Thom et al. |
| 2006/0225165 A1 | 10/2006 | Maassen et al. |
| 2008/0286989 A1* | 11/2008 | Strauss ................. H01R 12/57 439/55 |
| 2009/0008632 A1 | 1/2009 | Bunyk et al. |
| 2009/0099025 A1 | 4/2009 | Uchaykin |
| 2009/0173936 A1 | 7/2009 | Bunyk |
| 2010/0052024 A1 | 3/2010 | Kiyomura et al. |
| 2011/0022820 A1 | 1/2011 | Bunyk et al. |
| 2012/0007230 A1 | 1/2012 | Hwang et al. |
| 2012/0068334 A1 | 3/2012 | Migita et al. |
| 2013/0234909 A1* | 9/2013 | Koh ........................ H01Q 1/38 343/860 |
| 2015/0119252 A1 | 4/2015 | Ladizinsky et al. |
| 2016/0348245 A1 | 12/2016 | Jin et al. |

FOREIGN PATENT DOCUMENTS

| | | |
|---|---|---|
| CN | 103918357 A | 7/2014 |
| EP | 0150512 A2 | 8/1985 |
| EP | 0164757 A2 | 12/1985 |
| EP | 2225175 A1 | 9/2010 |
| TW | 200952589 A | 12/2009 |
| TW | 201734264 A | 10/2017 |
| WO | 2010039936 A1 | 4/2010 |
| WO | 2017155531 A1 | 9/2017 |
| WO | 2018106942 A1 | 6/2018 |

OTHER PUBLICATIONS

Amin, "Effect of Local Minima on Adiabatic Quantum Optimization," Physical Review Letters 100(130503), 2008, 4 pages.

Ardvan et al., "Nanoscale solid-state quantum computing", Philosophical Transactions of the Royal Society of London, Jun. 11, 2003.

Blatter et al., "Design aspects of superconducting-phase quantum bits," Physical Review B 63: 174511-1-174511-9, 2001.

F. Pobell, "Matter and Methods at Low Temperatures", 2nd Edition, Jun. 18, 1905.

Farhi et al., "Quantum Adiabatic Evolution Algorithms versus Simulated Annealing," MIT-CTP #3228, arXiv:quant-ph/0201031 v1, pp. 1-16, Jan. 8, 2002.

Feynman, "Simulating Physics with Computers," International Journal of Theoretical Physics 21(6/7): 467-488, 1982.

Friedman et al., "Quantum superposition of distinct macroscopic states," Nature 406:43-46, Jul. 6, 2000.

Il'ichev et al., "Continuous Monitoring of Rabi Oscillations in a Josephson Flux Qubit," Physical Review Letters 91(9): 097906-1-097906-4, week ending Aug. 29, 2003.

International Search Report and Written Opinion dated Apr. 5, 2018, for PCT/US2017/065152 in 10 pages.

Krenner et al., "Recent advances in exciton-based quantum information processing in quantum dot nanostructures", New Journal of Physics, Aug. 26, 2005.

Maassen van den Brink et al., "Mediated tunable coupling of flux qubits," New Journal of Physics 7:1-18, 2005.

Makhlin et al., "Quantum-state engineering with Josephson-junction devices," Reviews of Modern Physics 73 (2):357-400, Apr. 2001.

Mooij et al., "Josephson Persistent-Current Qubit," Science 285:1036-1039, Aug. 13, 1999.

Nielsen et al., Quantum Computation and Quantum Information, Cambridge University Press, Cambridge, 2000, "7.8 Other implementation schemes," pp. 343-345.

Orlando et al., "Superconducting persistent-current qubit," Physical Review B 60(22):15398-15413, Dec. 1, 1999.

Shor, "Introduction to Quantum Algorithms," AT&T Labs—Research, arXiv:quant-ph/0005003 v2, pp. 1-17, Jul. 6, 2001.

T. Miyazaki, S. Yorozu, M. Maezawam M. Hidaka, J-S Tsai, "Development of SFQ Multi-Chip Modules for Quantum Bits", IEEE Transactions on Applied Superconductivity, Jun. 2007.

T. Ogashiwa et al., "Flip-Chip Bonding Using Superconducting Solder Bump", Jpn. J. Appl. Phys., Aug. 1995.

T. P. Spiller, I. D'Amico & B. W. Lovett, "Entanglement distribution for a practical quantum-dot-based quantum processor architecture", New Journal of Physics, Jan. 29, 2007.

Yokoyama et al., "Robust Superconducting Die Attach Process", IEEE Transactions on Applied Superconductivity, Jun. 1997.

Non Final Office Action for U.S. Appl. No. 16/465,765, dated Jun. 28, 2022, 7 pages.

(56) References Cited

OTHER PUBLICATIONS

Non-Final Office Action issued in U.S. Appl. No. 16/896,554, dated Aug. 11, 2022, 2021, 8 pages.

PubChem Sodium 4-hydroxybenzenesulfonate (Compound) URL: https://pubchem.ncbi.nlm.nih.gov, Sep. 14, 2005, 22 pages.

"Detailed Procedures of Plating Copper for PCB Processing", PCBWay, Sep. 14, 2018, 6 pages.

"Thetawet TM Fs-8150" Short-Chain Telomer-based Fluorosurfactant, Technical Data Sheet, Innovative Chemical Technologies, Inc., US EPA 2010/2015—2 pages.

Feng, et al., "CupricChloride-HCl Acid Microetch Roughening Process", PCB Fabriction, OnBoard Technology Sep. 2008—4 pages.

Tang, et al., "Advance Surfactant-Modified Wet Anisotropic Etching", ResearchGate, Nagoya University Japan, Chapter—Dec. 2011, 25 pages.

Notice of Allowance for U.S. Appl. No. 16/465,765, dated d Dec. 14, 2022, 9 pages.

\* cited by examiner

PRINTED CIRCUIT BOARD ASSEMBLY FOR EDGE-COUPLING TO AN INTEGRATED CIRCUIT

FIELD

This disclosure generally relates to devices, systems, and methods for electrically coupling an integrated circuit to a set of coaxial lines. A device sample holder assembly can include a printed circuit board that edge-couples to an integrated circuit to conserve space. The disclosed techniques can be used to package a superconducting quantum processor and to communicatively couple the superconducting quantum processor to a digital computer.

BACKGROUND

Superconducting Processor

An integrated circuit may take the form of a superconducting processor, where the superconducting processor may be a classical processor or a quantum processor. A superconducting quantum processor may make use of quantum effects such as quantum tunneling, superposition, and/or entanglement whereas a superconducting classical processor may not make use of these effects, but may rather operate by emphasizing different principles, such as for example the principles that govern the operation of semiconducting classical processors. However, there may still be certain advantages to the implementation of such superconducting "classical" processors. Due to their natural physical properties, superconducting classical processors may be capable of higher switching speeds and shorter computation times than non-superconducting processors, and therefore it may be more practical to solve certain problems on superconducting classical processors. The present systems and methods are particularly well-suited for use with both superconducting quantum processors and superconducting classical processors. Further details and embodiments of exemplary quantum processors that may be used in conjunction with the present systems and devices are described in, for example, U.S. Pat. Nos. 7,533,068, 8,008,942, 8,195,596, 8,190,548, and US Patent Publication 2011-2062820.

Surface Mount Packaging

One traditional approach for packaging an integrated circuit is using surface mount packaging such as a ball grid array package. A ball grid array package includes solder bumps that are placed on the underside of the package carrying the chip. That is, one surface of the package carries the chip and the reverse surface of the package carries an array of solder bumps or solder balls (i.e., a ball grid array). Solder balls which establish an electrical connection between two electrical current paths are placed in a grid pattern and fitted onto a corresponding set of conductive traces of a printed circuit board (PCB). Solder balls are placed sufficiently far apart so that they do not bridge together when heated. Heating the solder balls occurs during a solder reflow process that melts the solder balls after the package is aligned with conductive traces of the PCB. The solder balls are then cooled and solidified to form continuous electrically conductive connections. Ball grid array packages are commonly used in the semiconductor industry. Moore's Law observes that the number of transistors in a non-superconducting integrated circuit approximately doubles each year as the density of transistors on a chip increases each year. However, the density of superconducting integrated circuit constituents, such as qubits of a superconducting quantum processor, cannot be as easily increased.

A superconducting quantum processor comprises qubits and other superconducting components (e.g., couplers, control circuitry, etc.). In general, smaller qubits and superconducting components are desirable but the degree to which qubits and superconducting components can decrease in size is limited by fabrication capabilities. The density of superconducting components may not be easily increased on a superconducting quantum processor. As the number of qubits and superconducting components increases, the surface area of a superconducting quantum processor may need to scale up accordingly. Therefore, a ball grid array package that carries a superconducting quantum processor will require more solder balls to sufficiently couple to an increased number of qubits. A ball grid array package can carry a superconducting quantum processor on one surface and electrically couple to a PCB on the reverse-surface. A set of connectors (e.g., coaxial connectors, radio frequency or SMP or SMA connectors, etc.) can provide conductive signal paths from the PCB to an input/output (I/O) system.

It can be advantageous for a ball grid array design to have the smallest footprint possible. However, this can be a challenge for larger circuits because each interconnect that can transfer signals from a PCB to an integrated circuit requires a corresponding conductive trace that can transfer signals from the ball grid array to the PCB for readout. A conductive trace that transfers signals from the ball grid array to the PCB for readout is typically positioned between interconnects. Additionally, it is also generally necessary for the conductive trace to be enclosed in a shield and/or ground line that provides a return path for current flowing from conductive traces. Ground connections can mitigate crosstalk between conductive traces and noise caused by external electromagnetic fields. Thus, the conductive traces and ground lines can add to the footprint of the ball grid array design. The solder balls of a ball grid array package must electrically couple to conductive traces of a PCB through a set of vias. As the number of conductive traces increases, it can become unmanageable for conductive traces and corresponding shields to electrically couple to solder balls near the center of the ball grid array. For example, the length of a first conductive trace and a first shield can block or prevent a second conductive trace and a second shield from electrically coupling to a solder ball. As the number of qubits increases and the size of the integrated circuit scales accordingly, some solder balls may be unused. Thus, the ball grid array area that the integrated circuit requires becomes significantly larger as the number of qubits and size of the integrated circuit increases.

Another disadvantage of ball grid array packaging for PCBs is that connections are typically limited to "flip-chip" style connections. The ball grid array is on one side of the package while the integrated circuit is fixed to the underside of the package. The arrangement eliminates the ability to wire bond the conductive traces of the PCB to conductive pads of the integrated circuit. The ability to wire bond to a chip while maximizing use of PCB surface area can be useful in certain applications. Therefore, ball grid array packaging can be undesirable in some cases.

An assembly that includes an integrated circuit, a PCB, a ball grid array package, and coaxial connectors can be carried by a sample holder. As the area of the integrated circuit increases, the number of coaxial connectors needed may also increase which adds bulk to the sample holder. In the case of a superconducting integrated circuit, the operating conditions must be at cryogenic temperatures (e.g., at 15 milliKelvin). The superconducting integrated circuit must be thermally coupled to a cryogenic refrigerator inside a cryostat. Therefore, increasing the number of qubits can become a challenge because the sample holder must fit within the confines of a cryostat.

There is thus a general desire for devices, systems and methods for scalable packaging of an integrated circuit, such as a superconducting quantum processor, that has reduced bulk and satisfies minimal footprint design objectives.

The foregoing examples of the related art and limitations related thereto are intended to be illustrative and not exclusive. Other limitations of the related art will become apparent to those of skill in the art upon a reading of the specification and a study of the drawings.

BRIEF SUMMARY

There exists a need to be able to electrically couple a PCB to an integrated circuit using packaging that is scalable. It is desirable for the packaging and the PCB footprint to be minimal. Systems, methods, and devices are described which, at least in some implementations, allow for scalable packaging of an integrated circuit.

A printed circuit board (PCB) assembly for electrically coupling an integrated circuit to coaxial lines may be summarized as including a first PCB having a first surface, a second surface, and a plurality of conductive traces, each one of the plurality of conductive traces having a portion exposed at the second surface of the first PCB; and a first plurality of coaxial connectors carried by the first surface of the first PCB, each one of the first plurality of coaxial connectors having a respective inner conductor, wherein each one of the plurality of conductive traces is electrically coupled to the inner conductor of a respective one of the first plurality of coaxial connectors. Each conductive trace of the plurality of conductive traces may traverse from the first plurality of coaxial connectors towards the second surface of the first PCB. The first plurality of coaxial connectors may include a plurality of radio frequency connectors. The first surface of the first PCB may be at an angle to the second surface of the first PCB. Each conductive trace of the plurality of conductive traces can comprise at least one of: aluminum, niobium, tin, and copper.

The PCB assembly may further include a second PCB having a respective first surface and a respective second surface, and a second plurality of coaxial connectors carried by the first surface of the second PCB, wherein the first surface of the second PCB is parallel to the first surface of the first PCB. A distance between the first plurality of coaxial connectors and the second surface of the first PCB can be greater than a distance between the second plurality of coaxial connectors and the second surface of the second PCB. The first PCB can include a third surface, the second PCB can include a third surface, and the third surface of the first PCB can be pressed against the third surface of the second PCB. Each one of the first plurality of coaxial connectors can face a first direction and each one of the second plurality of coaxial connectors can face a second direction, and the first direction can be different from the second direction. The PCB assembly can further include a third PCB having a respective first surface orthogonal to the first surface of the first PCB.

A method for assembling a sample holder that includes a plate carrying an integrated circuit, a printed circuit board (PCB) assembly including: a first PCB having a first surface, a second surface, and a plurality of conductive traces, each one of the plurality of conductive traces having a portion exposed at the second surface of the first PCB; a first plurality of coaxial connectors carried by the first surface of the first PCB, each one of the first plurality of coaxial connectors having a respective inner conductor, wherein each one of the plurality of conductive traces is electrically coupled to the inner conductor of a respective one of the first plurality of coaxial connectors; and the integrated circuit and the PCB assembly each have a respective set of fiducial marks, the sample holder operable to electrically couple an integrated circuit to coaxial lines, may be summarized as attaching the integrated circuit to the plate; attaching a plug of a kinematic mount to the plate; adjusting the location of the plug of the kinematic mount to align with the set of fiducial marks of the integrated circuit; securing the plug of the kinematic mount to the plate; attaching a receptacle of the kinematic mount to the PCB assembly; adjusting the location of the receptacle of the kinematic mount to align with the set of fiducial marks of the PCB assembly; securing the receptacle of the kinematic mount to the PCB assembly; and mating the plug of the kinematic mount to the receptacle of the kinematic mount.

Attaching the integrated circuit on the plate may include adhering the integrated circuit to the plate. The method may further include pressing the PCB assembly to the integrated circuit. Adjusting the location of the receptacle of the kinematic mount to align with the set of fiducial marks of the PCB assembly may include adjusting the location of the receptacle of the kinematic mount to align with the set of fiducial marks of the PCB assembly located on the second surface of the PCB. Attaching the plug of the kinematic mount to the plate may include movably attaching the plug of the kinematic mount to the plate.

BRIEF DESCRIPTION OF THE SEVERAL VIEWS OF THE DRAWING(S)

In the drawings, identical reference numbers identify similar elements or acts. The sizes and relative positions of elements in the drawings are not necessarily drawn to scale. For example, the shapes of various elements and angles are not necessarily drawn to scale, and some of these elements may be arbitrarily enlarged and positioned to improve drawing legibility. Further, the particular shapes of the elements as drawn, are not necessarily intended to convey any information regarding the actual shape of the particular elements, and may have been solely selected for ease of recognition in the drawings.

DETAILED DESCRIPTION

Figure 1A:
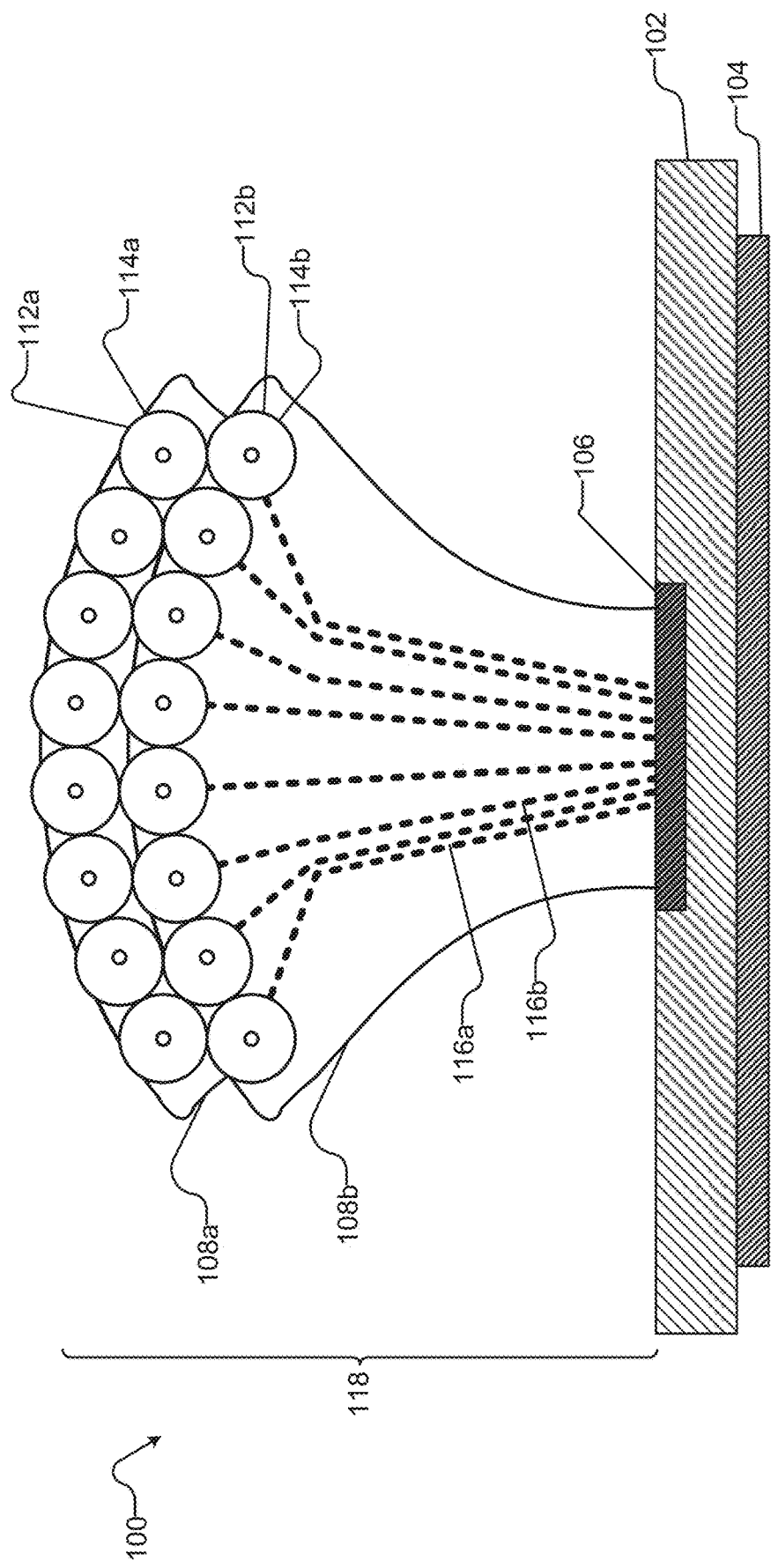
FIG. 1A is a front view of an example sample holder that includes a PCB edge-coupled to an integrated circuit.

In the following description, certain specific details are set forth in order to provide a thorough understanding of various disclosed implementations. However, one skilled in the relevant art will recognize that implementations may be practiced without one or more of these specific details, or with other methods, components, materials, etc. In other instances, well-known structures associated with computer systems, server computers, and/or communications networks have not been shown or described in detail to avoid unnecessarily obscuring descriptions of the implementations.

Unless the context requires otherwise, throughout the specification and claims that follow, the word "comprising" is synonymous with "including," and is inclusive or open-ended (i.e., does not exclude additional, unrecited elements or method acts).

Reference throughout this specification to "one implementation" or "an implementation" means that a particular feature, structure or characteristic described in connection with the implementation is included in at least one implementation. Thus, the appearances of the phrases "in one implementation" or "in an implementation" in various places throughout this specification are not necessarily all referring to the same implementation. Furthermore, the particular features, structures, or characteristics may be combined in any suitable manner in one or more implementations.

As used in this specification and the appended claims, the singular forms "a," "an," and "the" include plural referents unless the context clearly dictates otherwise. It should also be noted that the term "or" is generally employed in its sense including "and/or" unless the context clearly dictates otherwise.

The headings and Abstract of the Disclosure provided herein are for convenience only and do not interpret the scope or meaning of the implementations.

A surface mount package such as a ball grid array package can be useful for electrically coupling an integrated circuit to a PCB. However, as the integrated circuit becomes larger, the size of the ball grid array package may also increase, resulting in a large number of unused solder balls. Unused solder balls can unnecessarily take up space and this is undesirable if the sample holder must fit into a constrained space. For example, a superconducting integrated circuit and its packaging must fit into a cryostat in order to operate at sub-Kelvin temperatures. The present devices, systems, and methods describe a design in which a traditional ball grid array is replaced by an assembly that includes a PCB that can "edge-couple" to an integrated circuit. The PCB has a first surface supporting a set of coaxial connectors and a second surface exposing the conductive traces of the PCB, wherein the first surface and the second surface are at an angle to or orthogonal to each other. The first surface can be a shield layer or ground plane of the PCB. The second surface can be considered the "edge" of the PCB. The conductive traces of the PCB can electrically couple to the conductive pads or signal paths of an integrated circuit when the second surface of the PCB is pressed against the face of the integrated circuit such that the conductive traces align with the conductive pads or signal paths. The PCB can then be considered "edge-coupled" to the integrated circuit. By using perpendicular planes, the number of unused solder balls is minimized and space is conserved. Additionally, the assembly has the capability of wire bonding conductive traces of the PCB to conductive pads at the periphery of the integrated circuit while also "edge-coupling" to the PCB, thus allowing for a greater number of connections. Applications of a PCB that is operable to edge-couple to an integrated circuit are described in U.S. Pat. No. 8,441,329 titled "Input/Output systems and devices for use with superconducting based computing systems".

Throughout the specification of the present application and the appended claims, the terms "shield layer", "ground layer", "ground line", and "ground plane" are used interchangeably to describe external layers of a PCB that are used to ground certain electronic components by operating as a return path for current flowing through conductive traces. The shield layer can reduce interference and crosstalk between conductive traces in an overlying layer. The shield layer can be a copper foil that covers the conductive and insulative layers of the PCB.

FIG. 1A is a front view of an example sample holder 100. Sample holder 100 includes a plate 102 that is fixed to a pedestal 104. Plate 102 carries an integrated circuit 106. Plate 102 also carries an assembly 118 that includes a set of coaxial connectors (e.g., radio frequency or SMP or SMA connectors) 112a, 112b (collectively 112, only two called out to avoid clutter) and a plurality of PCBs 108a, 108b (collectively and individually 108). Coaxial connectors 112 are carried by a first surface of PCBs 108. Coaxial connectors 112 can be fixed to the first surface of PCB 108. For example, coaxial connectors 112 can be soldered to the first surface of PCB 108. Each coaxial connector 112a, 112b in the set of coaxial connectors 112 has an inner conductor 114a, 114b (collectively 114, only two called out to avoid clutter). Inner conductor 114a, 114b can sometimes be referred to as a "pin" of a coaxial connector. A distance between a set of coaxial connectors 112 that is supported by a first PCB 108a and a second surface of first PCB 108a can be greater than a distance between a set of coaxial connectors that is supported by a second PCB 108b and a second surface of second PCB 108b. That is, the set of coaxial connectors 112 that is supported by the first PCB 108a can be stacked above the set of coaxial connectors 112 that is supported by the second PCB 108b relative to a horizontal plane. Each PCB 108a, 108b has a set of conductive traces 116a, 116b (individually and collectively 116, only two called out to avoid clutter) as illustrated by dash lines. PCBs 108 each have a shield layer that overlies a respective set of conductive traces 116. In some implementations, the shield layer of PCBs 108 is formed from a material comprising copper or consisting of copper.

Figure 1B:
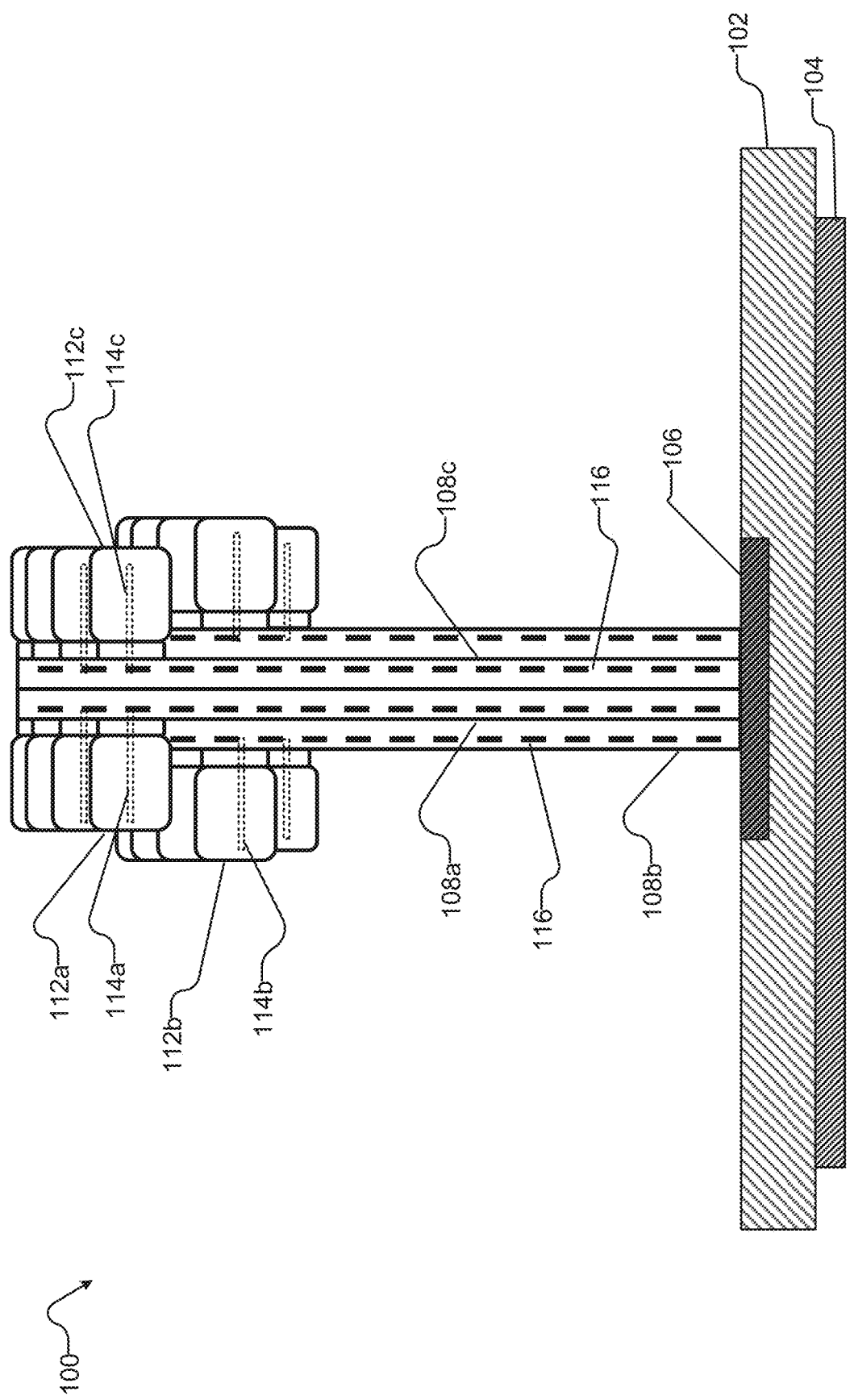
FIG. 1B is a side view of an example sample holder that includes a PCB edge-coupled to an integrated circuit.

FIG. 1B is a side view of example sample holder 100. Each PCB 108 has a respective set of conductive traces 116. Conductive traces 116 of PCBs 108 traverse from coaxial connectors 112 towards integrated circuit 106. Each inner conductor 114 of coaxial connectors 112 is operable to electrically couple to a respective coaxial line and to conductive traces 116 of PCBs 108. For example, inner conductor 114a of coaxial connector 112a is operable to electrically couple to a coaxial line and to a conductive trace 116 of PCB 108a. In some implementations, conductive traces 116 of PCBs 108 can comprise copper. In some implementations, conductive traces 116 of PCBs 108 can comprise a superconducting material (e.g., aluminum, niobium, or a combination thereof). The length of each conductive trace 116 of each PCB 108 is covered by an electrically insulative material. In some implementations, the electrically insulative material can be covered by a polyimide and/or a PTFE composite (e.g., Rogers PTFE). One portion of each conductive trace 116 is exposed at a second surface of each PCB 108a, 108b. The exposed portion of each conductive trace 116 can be an exposed end of each conductive trace 116. The second surface of a first PCB 108a can be parallel with the second surface of a second PCB 108b. The exposed portions of conductive traces 116 of PCBs 108 can align with at least one conductive pad or conductive signal path of integrated circuit 106. Conductive traces 116 can sometimes be referred to as buried traces. The second surface of each PCB 108 can be pressed to integrated circuit 106 such that at least one conductive trace 116 of each PCB 108 is operable to electrically couple to a conductive signal path of integrated circuit 106.

Figure 1C:
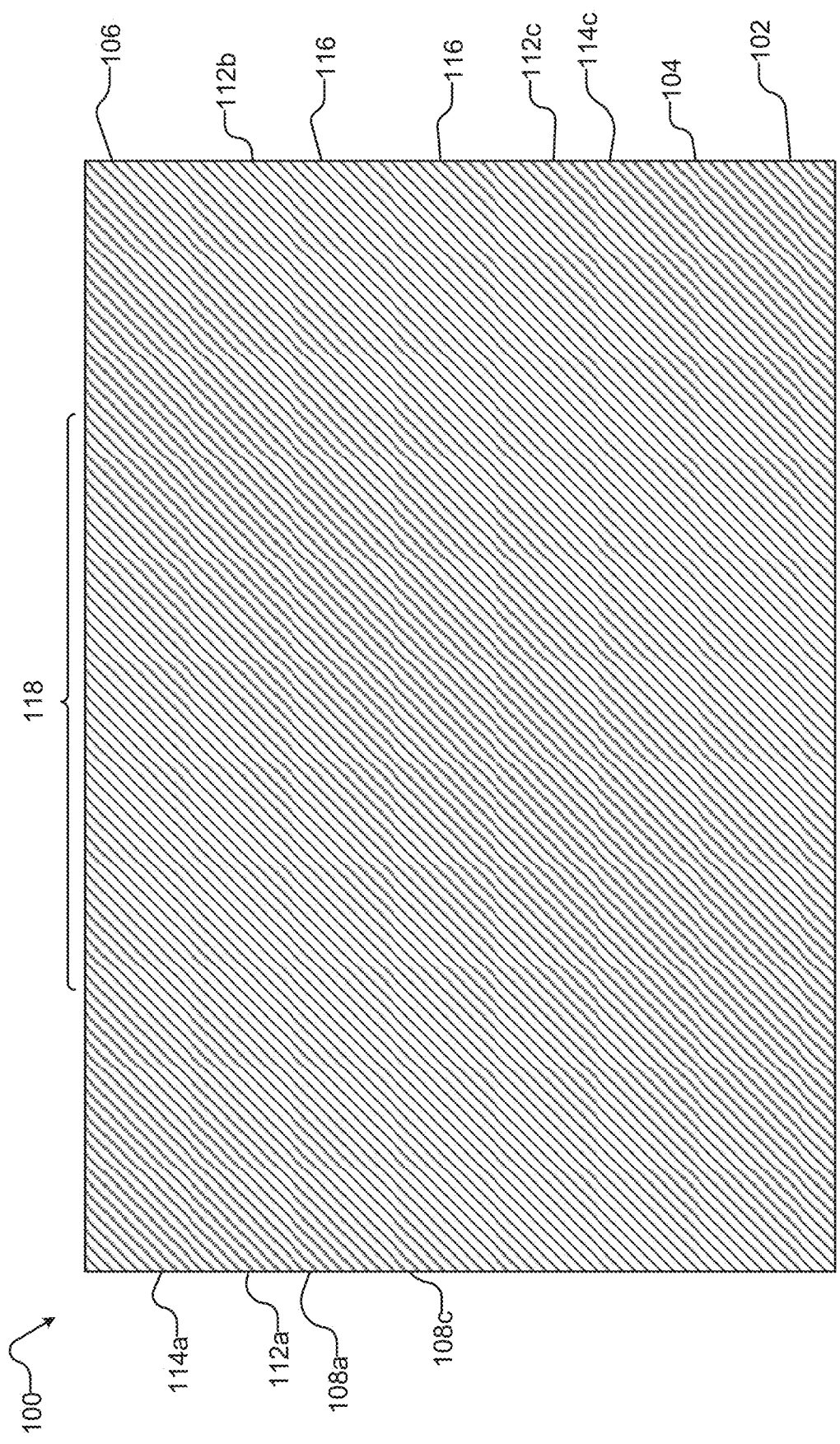
FIG. 1C is a top view of an example sample holder that includes a PCB edge-coupled to an integrated circuit.

FIG. 1C is a top view of example sample holder 100. The first surface of first PCB 108a is pressed against a third surface of second PCB 108b to form a part of assembly 118. For each PCB 108, the third surface may be on the opposite side of PCB 108 relative to the first surface of PCB 108. Assembly 118 can be further constructed by pressing a third surface of first PCB 108a against a third surface of third PCB 108c such that each respective set of coaxial connectors is facing different directions. A set of coaxial connectors carried by the first surface of first PCB 108a faces a first direction and a set of coaxial connectors carried by the first surface of third PCB 108c faces a second direction that is different from the first direction. In one implementation, the first direction is opposite to the second direction. The first surface of each PCB 108 can be parallel with one another. Conductive traces of first PCB 108a and coaxial connectors of first PCB 108a are shielded and isolated from conductive traces of second PCB 108b and coaxial connectors of second PCB 108b. In one implementation, shielding may be implemented by a shield layer formed from copper that overlies a wiring layer that includes conductive traces 116.

Plate 102 can include a frame that holds integrated circuit 106 and a set of clamps to secure integrated circuit 106 to plate 102. In one implementation, plate 102 can further include a lid that overlies integrated circuit 106 and a set of clamps that secure the lid over integrated circuit 106. Plate 102 can comprise copper, brass, or a combination thereof. Assembly 118, integrated circuit 106, and plate 102 are mounted onto pedestal 104. In some implementations, assembly 118 can include more than two PCBs 108. In such cases, coaxial connectors 112 of first and second PCBs 108a, 108b can be positioned above or stacked above coaxial connectors 112 of an additional PCB 108 relative to integrated circuit 106 when integrated circuit 106 is on a horizontal plane. In some implementations, assembly 118 can include more than one integrated circuit 106. In such cases, each integrated circuit can have at least one respective PCB 108 pressed against its surface. Each integrated circuit 106 is operable to electrically couple to a respective PCB 108 via a set of conductive traces 116.

Sample holder 100 can be positioned inside a cryostat and thermally coupled to a cryogenic refrigerator to bring the operating temperature of integrated circuit 106 to below 1 Kelvin. Integrated circuit 106 can be communicatively coupled to an I/O system via conductive traces 116 of PCB 108 and coaxial lines coupled to coaxial connectors 112. Elements of sample holder 100 can operate in response to instructions given by a user via a digital computer. For example, a user may provide instructions to activate a set of control lines in integrated circuit 106 via a digital computer. The digital computer may communicate with integrated circuit 106 via signals that are carried by conductive traces 116 and coaxial connectors 112 to execute the instructions. Elements of sample holder 100 can also operate to read out results from integrated circuit 106. For example, integrated circuit 106 can include qubits and couplers that operate to solve a problem received from a digital computer. A result or solution to the problem can be sent to the digital computer via signals that are carried by conductive traces 116 and coaxial connectors 112.

Figure 2:
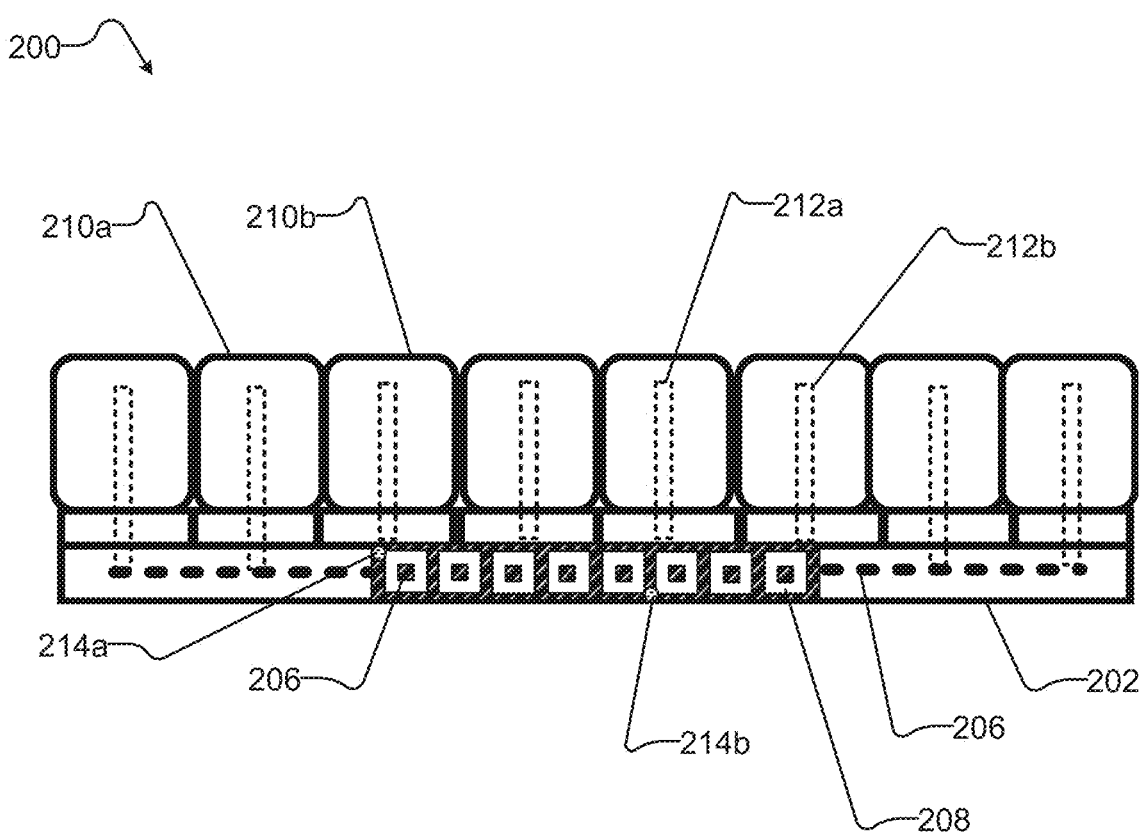
FIG. 2 is a bottom view of a PCB assembly that is operable to edge-couple to an integrated circuit.

FIG. 2 is a bottom view of a PCB assembly 200. PCB assembly 200 can be used in place of or in addition to assembly 118 of FIG. 1. Assembly 200 includes a PCB 202 that has a set of conductive traces 206. In some implementations, conductive traces 206 can comprise copper. In some implementations, conductive traces 206 can comprise a material that is superconductive in a range of temperatures (e.g., aluminum, niobium, tin, or a combination thereof). Each conductive trace 206 is covered by an insulative layer 208 so that conductive traces do not electrically couple to one another. In some implementations, insulative layer 208 can comprise an electrically insulative material such as a polyimide and/or a PTFE composite (e.g., Rogers PTFE). A shield layer may overlie conductive traces 206 of PCB 202 to minimize negative effects of noise from external electromagnetic fields. A first surface of PCB 202 supports a set of coaxial connectors 210 (e.g., radiofrequency or SMP connectors) that each have an inner conductor 212a, 212b (only two called out to avoid clutter) that is operable to be electrically coupled to a conductive trace 206. A portion of each conductive trace 206 is exposed at a second surface of PCB 202. Conductive traces 206 can sometimes be referred to as "buried traces". The exposed portions of conductive traces 206 can sometimes be referred to as "coaxial ports" or "RF ports". The second surface of PCB 202 can be planar and at an angle (e.g., orthogonal) to the first surface of PCB 202. The exposed portion of each conductive trace at the second surface of PCB 202 can be aligned with electrically conductive pads or conductive signal paths of an integrated circuit such as integrated circuit 106 of FIG. 1A to FIG. 1C or integrated circuit 400 of FIG. 4. The second surface of PCB 202 can also have a set of fiducial marks 214a, 214b that are used to align the exposed conductive traces of PCB 202 with electrically conductive pads of an integrated circuit. The integrated circuit can be operable to electrically couple to a set of coaxial lines via a continuous signal path formed from conductive traces 206 of PCB 202 and inner conductors 212 of coaxial connectors 210. FIG. 2 illustrates an implementation of assembly 200 that includes eight coaxial connectors 210 supported by the first surface of PCB 202. However, other implementations can include a more or less than eight coaxial connectors 210 that are supported by the first surface of PCB 202. In such cases, PCB 202 can include a corresponding number of conductive traces 206 that couple to coaxial connectors 210.

Figure 3A:
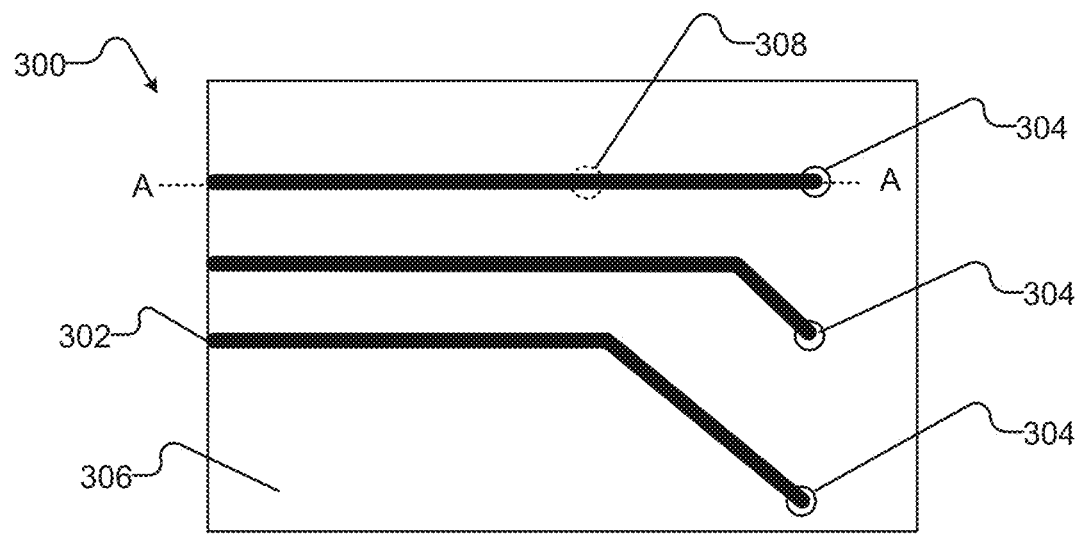
FIG. 3A is a top view of a cross-section of an example PCB that is operable to edge-couple to an integrated circuit.

FIG. 3A is a top view of a cross-section of an example PCB 300. PCB 300 includes a set of conductive traces 302 that are each electrically coupled to a respective coaxial connector port 304 (individually and collectively 304). Conductive traces 302 can be formed on a conductive layer that overlies at least one other conductive layer and at least one other insulative layer. In one implementation, conductive traces 302 can comprise at least one of: copper, aluminum, tin, and niobium. Conductive traces 302 traverse PCB 300 from coaxial connector ports 304 towards a second surface of PCB 300 that can be pressed against an integrated circuit such as integrated circuit 106 in FIG. 1A to FIG. 1C. The second surface of PCB 300 can be orthogonal to the first surface of PCB 300. Conductive traces 302 are operable to electrically couple to an inner conductor of a coaxial connector via coaxial port 304. A portion of each one of conductive traces 302 can be exposed at the second surface of PCB 300. Conductive traces 302 are operable to electrically couple to conductive pads or conductive signal paths of an integrated circuit. Each coaxial port 304 can receive an inner conductor of a coaxial connector, such as coaxial connector 112 in FIG. 1A to FIG. 1C. Coaxial ports 304 are operable to electrically couple coaxial connectors to conductive traces 302. In one implementation, coaxial lines may be inserted into coaxial connectors at coaxial connector ports 304. In such implementations, conductive traces 302 are operable to electrically couple to coaxial lines via coaxial connectors and coaxial connector ports 304. It is desirable for conductive traces and signal paths to be isolated from one another to prevent electrical shorting the circuit in PCB 300. An insulative layer 306 surrounds each conductive trace 302 and each coaxial connector port 304 to electrically insulate conductive current paths from one another. Conductive traces 302 can underlie a shield layer that forms a first surface of PCB 300. The shield layer can comprise copper.

Figure 3B:
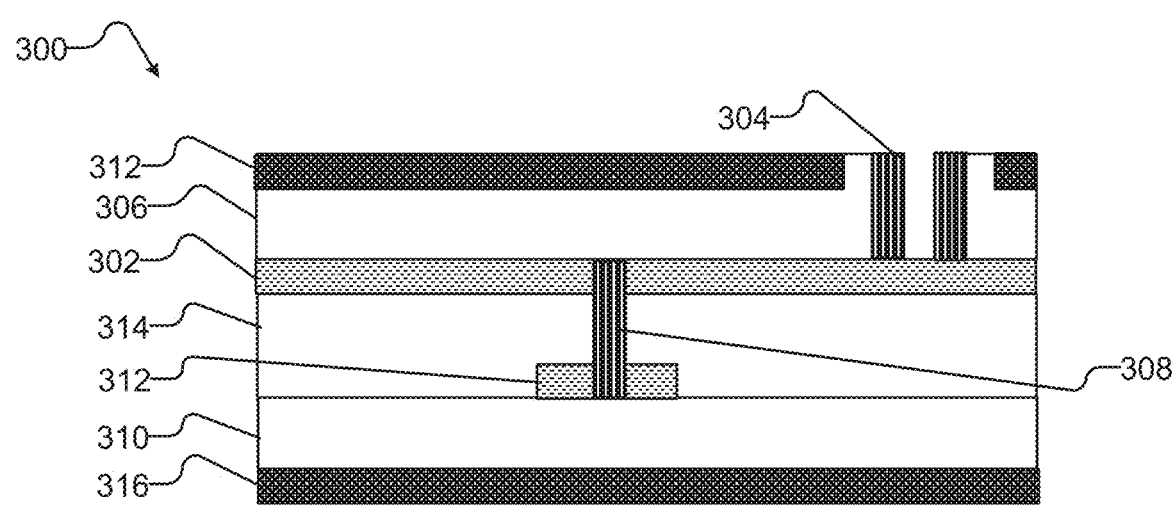
FIG. 3B is a cross-section view of an example PCB that is operable to edge-couple to an integrated circuit.

FIG. 3B is a cross-section view through line A-A of example PCB 300 in FIG. 3A. PCB 300 comprises a first conductive layer deposited on a first insulative layer 310. The first conductive layer can be patterned or etched to form at least a portion of a first conductive trace 312. A second insulative layer 314 can be deposited on the first conductive layer that includes first conductive trace 312. Second insulative layer 314 can be a laminate sheet that provides adhesion between the first conductive layer and a second conductive layer while also electrically insulating the conductive layers from each other. A second conductive layer can be deposited on second insulative layer 314. The second conductive layer can be patterned or etched to form at least a portion of a second conductive trace 302. A length of first conductive trace 312 can be positioned at an angle to a length of second conductive trace 302.

A via 308 extends at least partially through the first conductively layer including first conductive trace 312, the second conductive layer including second conductive trace 302, and second insulative layer 314 that is interposed between the conductive layers. Via 308 can be plated or filled with a conductive material to form an electrically conductive path between first conductive trace 312 and second conductive trace 302. In one implementation, via 308 is formed by drilling a hole through a stack comprising the first conductive layer and the second conductive layer, and then plating with or depositing a conductive material (e.g., tin or copper) in the hole to form an electrically conductive path between the conductive layers. The stack can then be adhered to first insulative layer 310. In some implementations, the stack comprising the first conductive layer and the second conductive layer may be adhered to first insulative layer 310 and then via 308 can be formed by drilling a hole only partially through the stack so that the hole does not extend all the way through first insulative layer 310 and then the hole can be plated with a conductive material.

A third insulative layer 306 is deposited on the second conductive layer that includes second conductive trace 302, forming a stack that comprises first insulative layer 310, first conductive trace 312, second insulative layer 314, second conductive trace 302, and third insulative layer 306. A first shield layer 316 is deposited on first insulative layer 310 and a second shield layer 312 is deposited on third insulative layer 306 (i.e., the reverse-side of the stack). First shield layer 316 can be electrically coupled to second shield layer 312 through a via (not illustrated in FIG. 3B). First shield layer 316 and second shield layer 312 can comprise copper. In some implementations, a shield layer can also be referred to as a "ground layer" or "ground plane". Each shield layer may be deposited so that an insulative layer is interposed between the respective shield layer and a conductive trace. For example, second shield layer 312 is deposited so that third insulative layer 306 is interposed between second shield layer 312 and second conductive trace 302. Furthermore, second shield layer 312 is deposited so that third insulative layer 306 is interposed between second shield layer 312 and a coaxial connector port 304.

Coaxial connector port 304 can be formed by drilling a hole through third insulative layer 306 to expose at least a portion of second conductive trace 302. The hole is then plated with a conductive material to form an electrically conductive path to second conductive trace 302. Coaxial connector port 304 is configured to receive an inner conductor of a coaxial connector, such as coaxial connector 116 in FIG. 1A to FIG. 1C. A coaxial connector is operable to electrically couple to a coaxial line. Thus, coaxial connector port 304 can electrically couple second conductive trace 302 to a coaxial line via a coaxial connector.

It is important to note that the number of coaxial connector ports, conductive traces, vias, and insulative layers illustrated in PCB 300 are only exemplary. In some implementations, PCB 300 can include more or less than two conductive layers and/or a different number of other elements (e.g., coaxial connector ports, insulative layers, etc.) than depicted.

Methods and systems for forming vias and through-holes in PCBs are described in further detail in Patent Publication No. WO2018/106942 titled "Superconducting printed circuit board related systems, methods, and apparatus".

Figure 4:
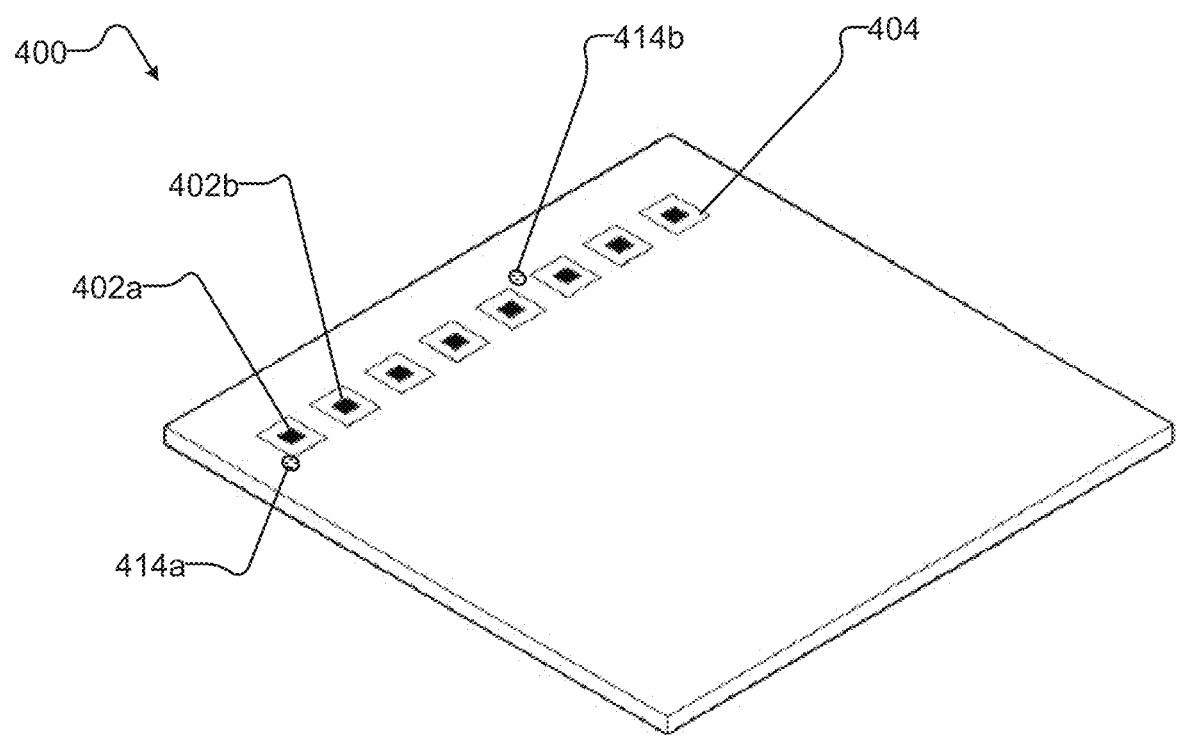
FIG. 4 is an isometric view of an example integrated circuit.

FIG. 4 is an isometric view of an example integrated circuit 400. Integrated circuit 400 has a set of conductive pads 402a, 402b (collectively and individually 402, only two called out to avoid clutter) that are exposed. Each conductive pad 402 is surrounded by an insulative layer 404 to prevent conductive pads from shorting. Conductive pads 402 can be continuously electrically connected to a set of signal paths transmit signals to and from components of an integrated circuit. For example, integrated circuit 400 can be a superconducting quantum processor that includes a set of qubits and couplers used to solve a problem sent by a digital computer. The superconducting quantum processor can solve the problem and the solution may be represented by a spin state of the set of qubits. The spin state can be transmitted as a signal to the digital computer via a set of transmission lines. In one implementation, transmission lines can be microwave lines that form a continuous signal path to conductive pads 402. Integrated circuit 400 can have a set of fiducial marks 414a, 414b (collectively 414) that are used to align conductive pads 402 of integrated circuit 400 with a set of conductive traces of a PCB (e.g., conductive traces 206 of PCB assembly 200 in FIG. 2). Fiducial marks 414 can be aligned with fiducial marks 214 of PCB assembly 200 in FIG. 2. In one implementation, method 500 of FIG. 5 can be used to align fiducial marks 414 of integrated circuit 400 with fiducial marks of a PCB assembly. Integrated circuit 400 can be pressed against a surface having exposed portions of conductive traces of PCB 202 in FIG. 2. Conductive pads 402 of integrated circuit 400 can be operable to electrically couple to conductive traces 206 of PCB 202 in FIG. 2.

Figure 5:
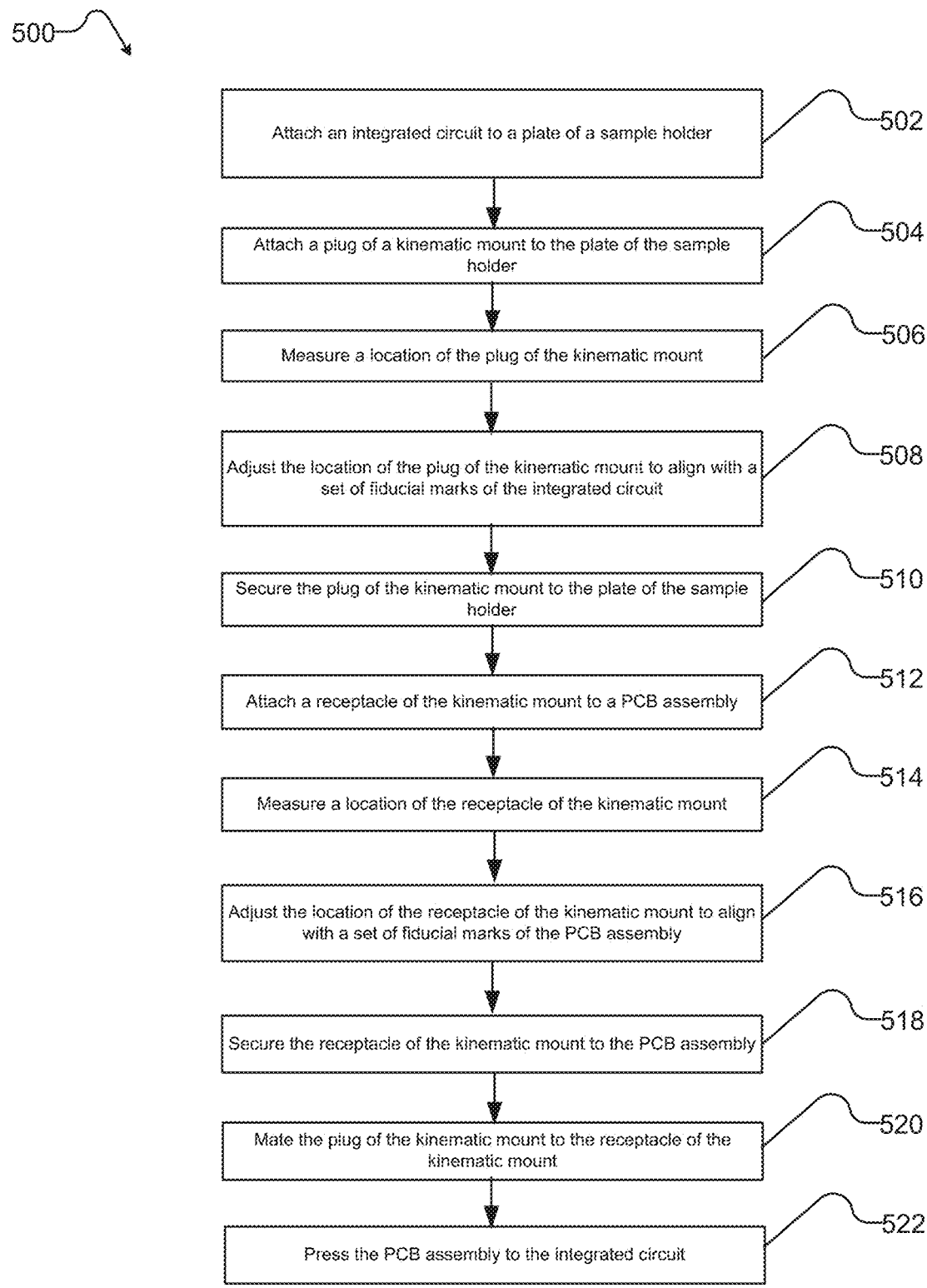
FIG. 5 is a flowchart illustrating a method for assembling a sample holder, in accordance with the present systems, methods, and apparatus.

FIG. 5 is flowchart illustrating a method 500 for assembling a sample holder in accordance with the present systems and methods. Method 500 includes acts 502-522, though in other implementations, certain acts can be omitted and/or additional acts can be added. At 502, an integrated circuit is attached to a plate of a sample holder. For example, a substrate layer of the integrated circuit can be adhered to the plate of the sample holder in a position that is suitable for packaging or wire bonding. Acts 504-520 can be performed to align a PCB assembly with the integrated circuit. At 504, a plug of a kinematic mount is attached to the sample holder. The plug of the kinematic mount may be designed to be secured to a sample holder such as sample holder 100 in FIG. 1A to 1C, either directly or indirectly via another component of the kinematic mount. The plug of the kinematic mount can be movably attached to the sample holder. For example, the plug of the kinematic mount or another component of the kinematic mount can have a metal-locating part that can be loosely bolted to the sample holder. At 506, a location of the plug of the kinematic mount is measured, for example, by using a measurement microscope. At 508, the location of the plug of the kinematic mount is adjusted to align with a set of fiducial marks of the integrated circuit (e.g., fiducial marks 414 of integrated circuit 400 in FIG. 4). The fiducial marks can be on a surface of the integrated circuit that overlies the substrate layer of the integrated circuit. At 510, the plug of the kinematic mount is secured to the sample holder. The plug of the kinematic mount can be tightly bolted to the sample holder after the plug of the kinematic mount is substantially aligned with the set of fiducial marks of the integrated circuit. At 512, a receptacle of the kinematic mount is attached to a PCB assembly. The receptacle of the kinematic mount is operable to mate with the plug of the kinematic mount. The receptacle of the kinematic mount can be movably attached to the PCB assembly. For example, the receptacle of the kinematic mount or another component of the kinematic mount can be loosely bolted to the PCB assembly. At 514, a location of the receptacle of the kinematic mount is measured, for example, by using the measurement microscope. At 516, the location of the receptacle of the kinematic mount is adjusted to align with a set of fiducial marks of the PCB assembly (e.g., fiducial marks 214 of PCB assembly 200 in FIG. 2). For example, the location of the receptacle of the kinematic mount can be adjusted to align with a set of fiducial marks of the PCB assembly located on the second surface of a PCB of the PCB assembly. At 518, the receptacle of the kinematic mount is secured to the PCB assembly. The receptacle of the kinematic mount can be tightly bolted or otherwise fastened to the PCB assembly after the receptacle of the kinematic mount is substantially aligned with the set of fiducial marks of the PCB assembly. At 520, the plug of the kinematic mount is mated with the receptacle of the kinematic mount. A set of conductive traces of the PCB assembly can be substantially aligned with a set of conductive pads of the integrated circuit. At 522, the PCB assembly is pressed to the integrated circuit such that a set of conductive traces of the PCB assembly is operable to electrically couple to a set of conductive pads of the integrated circuit.

Figure 6B:
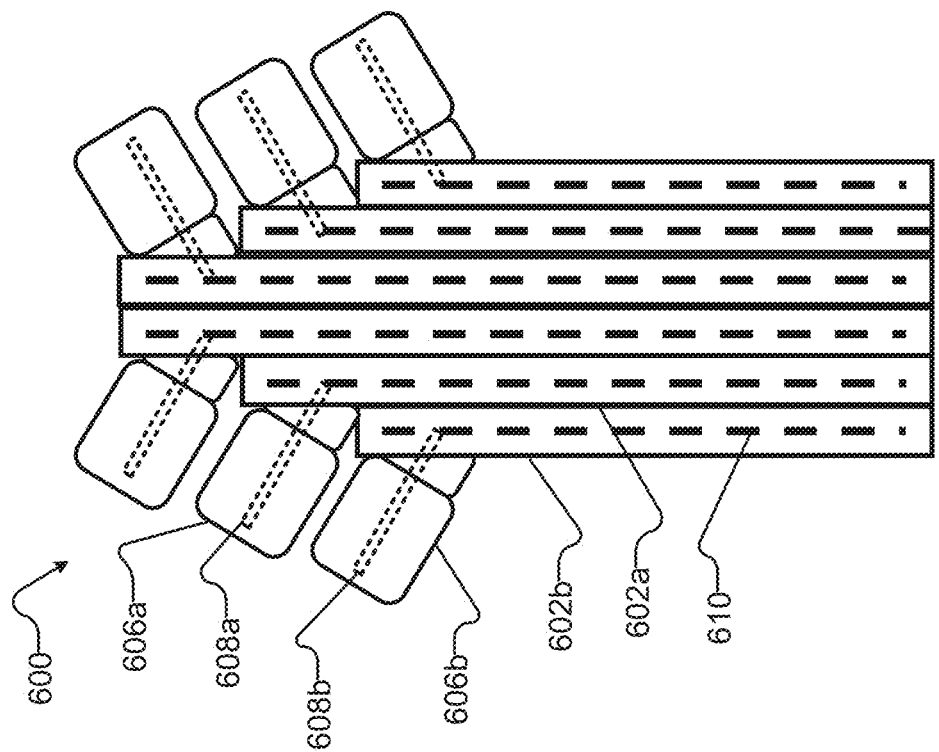
FIG. 6B is a side view of an example PCB assembly including angled coaxial connectors that is operable to edge-couple to an integrated circuit.
Figure 6A:
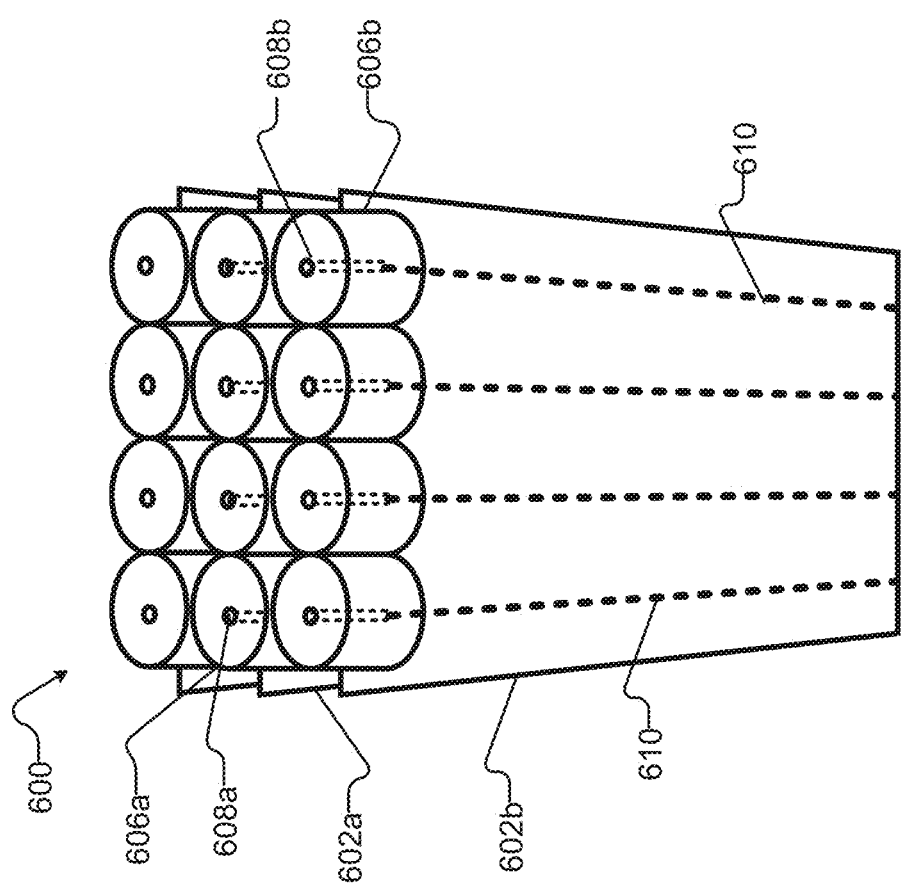
FIG. 6A is a front view of an example PCB assembly including angled coaxial connectors that is operable to edge-couple to an integrated circuit.

FIG. 6A is a front view of an example PCB assembly 600. PCB assembly 600 includes a set of coaxial connectors (e.g., radio frequency or SMP connectors) 606a, 606b (only two called out to avoid clutter) and a set of PCBs 602a, 602b (collectively and individually 602, only two called out to avoid clutter). Coaxial connectors 606 are carried by a first surface of PCB 602. Coaxial connectors 606 can be fixed to the first surface of PCB 602, for example, by soldering. Each coaxial connector 606 in the set of coaxial connectors 606 has an inner conductor 608a, 608b (only two called out to avoid clutter). Each coaxial connector 606 can receive a coaxial line. Each coaxial connector 606 can have a longitudinal axis that is at an angle (e.g., non-perpendicular) to the first surface of PCB 602. Each PCB 602 has a set of conductive traces 610 (only two called out to avoid clutter) that is illustrated by dash lines. PCBs 602 each have a shield layer that overlies conductive traces 610. In some implementations, the shield layer overlying conductive traces 610 can comprise copper.

Conductive traces 610 of PCBs 602 traverse from coaxial connectors 606 towards a second surface of PCB 602. The first surface of PCB 602 can be orthogonal to the second surface of PCB 602. Each inner conductor 608 of coaxial connectors 606 is operable to electrically couple to a respective coaxial line and to electrically couple to a conductive trace 610 of PCB 602. In one implementation, conductive traces 610 of PCB 602 can comprise copper. In some implementations, conductive traces 610 can comprise a material that is superconductive in a range of temperatures (e.g., aluminum, niobium, tin, or a combination thereof). The length of each conductive trace 610 is covered by an electrically insulative material such as a polyimide and/or a PTFE composite (e.g., Rogers PTFE). A portion of each conductive trace is exposed at the second surface of each PCB 602. The exposed portions of each one of the set of conductive traces 610 of PCBs 602 can each be aligned with at least one conductive pad or conductive signal path of an integrated circuit. A distance between the set of coaxial connectors 606 that are carried by a first surface of a first PCB 602a and a second surface of first PCB 602a can be greater than the distance between a set of coaxial connectors that are carried by a first surface of a second PCB 602b and a second surface of second PCB 602b. In some implementations, the first surface of the first PCB 602a is not parallel with the first surface of the second PCB 602b. For example, the first surface of the first PCB shield 602a may be at an angle relative to a horizontal plane and the first surface of the second PCB shield 602b may be orthogonal or at a sharper angle relative to the horizontal plane.

FIG. 6B is a side view of example PCB assembly 600. Each PCB 602 has a third surface that may be on the opposite side of the third surface. PCB assembly 600 can include a third PCB 602. The third surface of third PCB 602 can be pressed against the third surface of an additional PCB 602 such that respective sets of coaxial connectors are facing different directions. A set of coaxial connectors carried by the first surface of first PCB 602 can face a first direction and a set of coaxial connectors carried by the first surface of third PCB 602 can face a second direction that is different from the first direction. In one implementation, the first direction is at an angle to the second direction. Conductive traces 610 of each PCB 602 underlie a shield layer that minimizes negative effects of noise from external electromagnetic fields. In one implementation, the shield layer is formed from a material comprising copper.

Figure 7B:
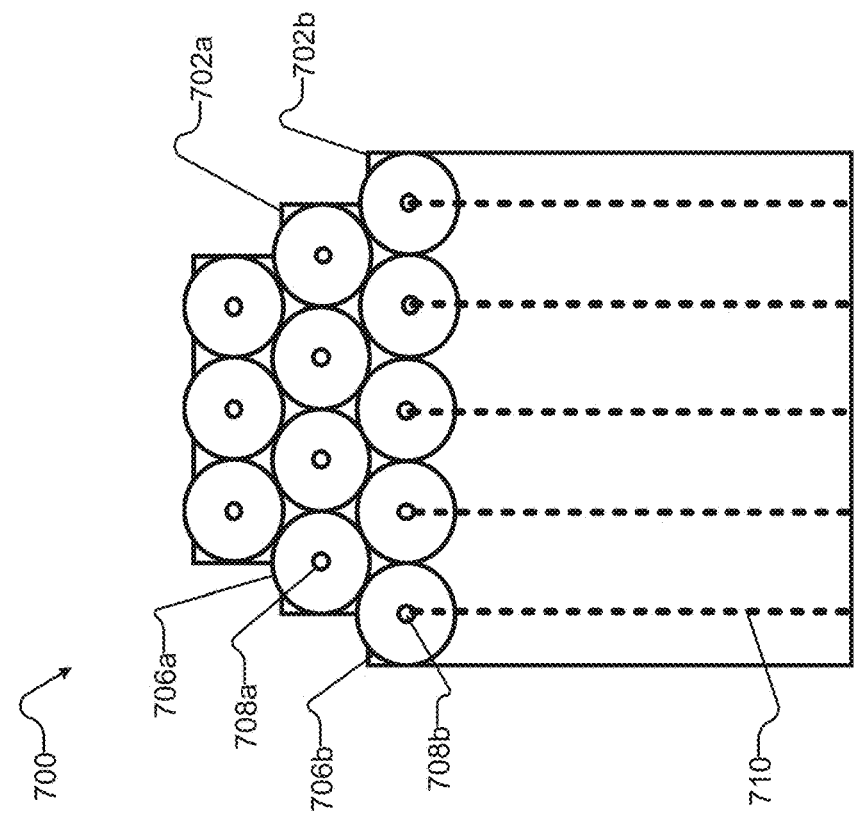
FIG. 7B is a side view of an example PCB assembly that includes a plurality of PCBs arranged to form a pyramidal structure.
Figure 7A:
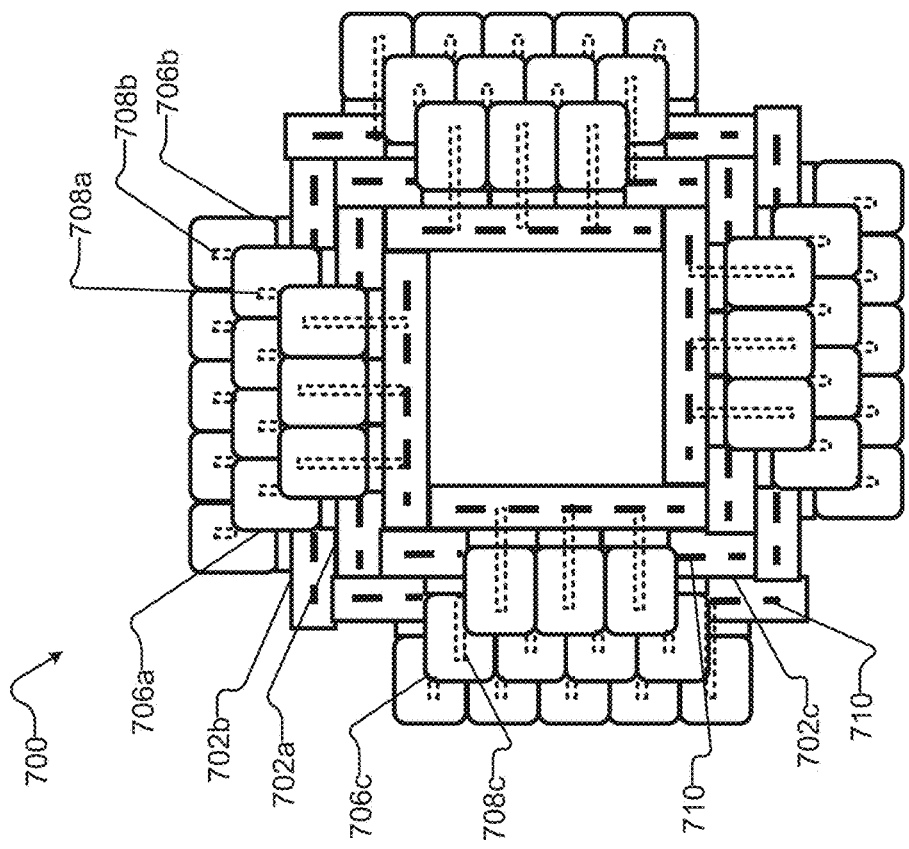
FIG. 7A is a top view of an example PCB assembly that includes a plurality of PCBs arranged to form a pyramidal structure.

FIG. 7A is a top view of an example PCB assembly 700. PCB assembly 700 includes a set of coaxial connectors 706a, 706b, 706c (collectively 706, only two called out to avoid clutter) and a set of PCBs 702a, 702b, 702c (collectively and individually 702, only two called out to avoid clutter). Coaxial connectors 706 are carried by a first surface of each PCB 702. Coaxial connectors 706 can be fixed to the first surface of PCB 702, for example, by soldering. Each coaxial connector 706 has an inner conductor 708a, 708b (collectively 708, only two called out to avoid clutter). Each coaxial connector 706 can be positioned orthogonally to the first surface of PCB 702. Each PCB has a set of conductive traces 710 (only two called out to avoid clutter) that are illustrated by the dash lines. PCBs 702 each have a shield layer that overlies conductive traces 710. A distance between the set of coaxial connectors 706 that are carried by a first surface of a first PCB 702a and a second surface of first PCB 702a can be greater than the distance between the set of coaxial connectors that are carried by a first surface of a second PCB 702b and a second surface of second PCB 702b.

PCB assembly 700 further includes a third PCB 702c that has a respective first surface supporting a set of coaxial connectors 706 and a respective second surface that can be pressed against an integrated circuit. Each PCB also has a third surface which is parallel with the first surface and orthogonal to the second surface of each respective PCB 702, the third surface forming a backside of PCB 702. Each PCB 702 also has a fourth surface that is orthogonal to the first surface and to the second surface of each respective PCB 702, forming a side of PCB 702. PCB assembly 700 illustrates an implementation in which the fourth surface of third PCB 702c can be pressed against the third surface of first PCB 702a. The first surface of third PCB 702c is orthogonal to the first surface of first PCB 702a. The set of coaxial connectors carried by first PCB 702a is positioned perpendicularly to the set of coaxial connectors carried by third PCB 702c. Additional PCBs can be positioned in a likewise arrangement such that a pyramidal structure (e.g., four sided pyramid) is formed in PCB assembly 700, with each PCB forming a layer in the pyramidal structure, that from a top of the pyramidal structure toward a bottom of the pyramidal structure extends peripherally outward beyond the periphery of the adjacent overlying layer. PCB assembly can be useful for applications that include more than one integrated circuit.

FIG. 7B is a side view of PCB assembly 700. Conductive traces 710 of PCBs 702 traverse from coaxial connectors 706 towards a second surface of PCB 702. The first surface of PCB 702 can be orthogonal to the second surface of PCB 702. Each inner conductor 708 of coaxial connectors 706 is operable to electrically couple to a respective coaxial line and to a conductive trace 710 of PCB 702. In one implementation, conductive traces 710 of PCB 702 can comprise copper. In some implementations, conductive traces 710 can comprise a material that is superconductive in a range of temperatures (e.g., aluminum, niobium, tin, or a combination thereof). The length of each conductive trace 710 is covered by an electrically insulative material such as a polyimide and/or a PTFE composite (e.g., Rogers PTFE). A portion of each conductive trace is exposed at the second surface of each PCB 702. The exposed portions of the set of conductive traces 710 of PCBs 702 can each be aligned with at least one conductive pad or conductive signal path of an integrated circuit. In some implementations, the shield layer overlying conductive traces 710 can comprise copper. Conductive traces 710 of each PCB 702 underlie a shield layer that minimizes negative effects of noise from external electromagnetic fields. In one implementation, the shield layer is formed from a material comprising copper.

Figure 8:
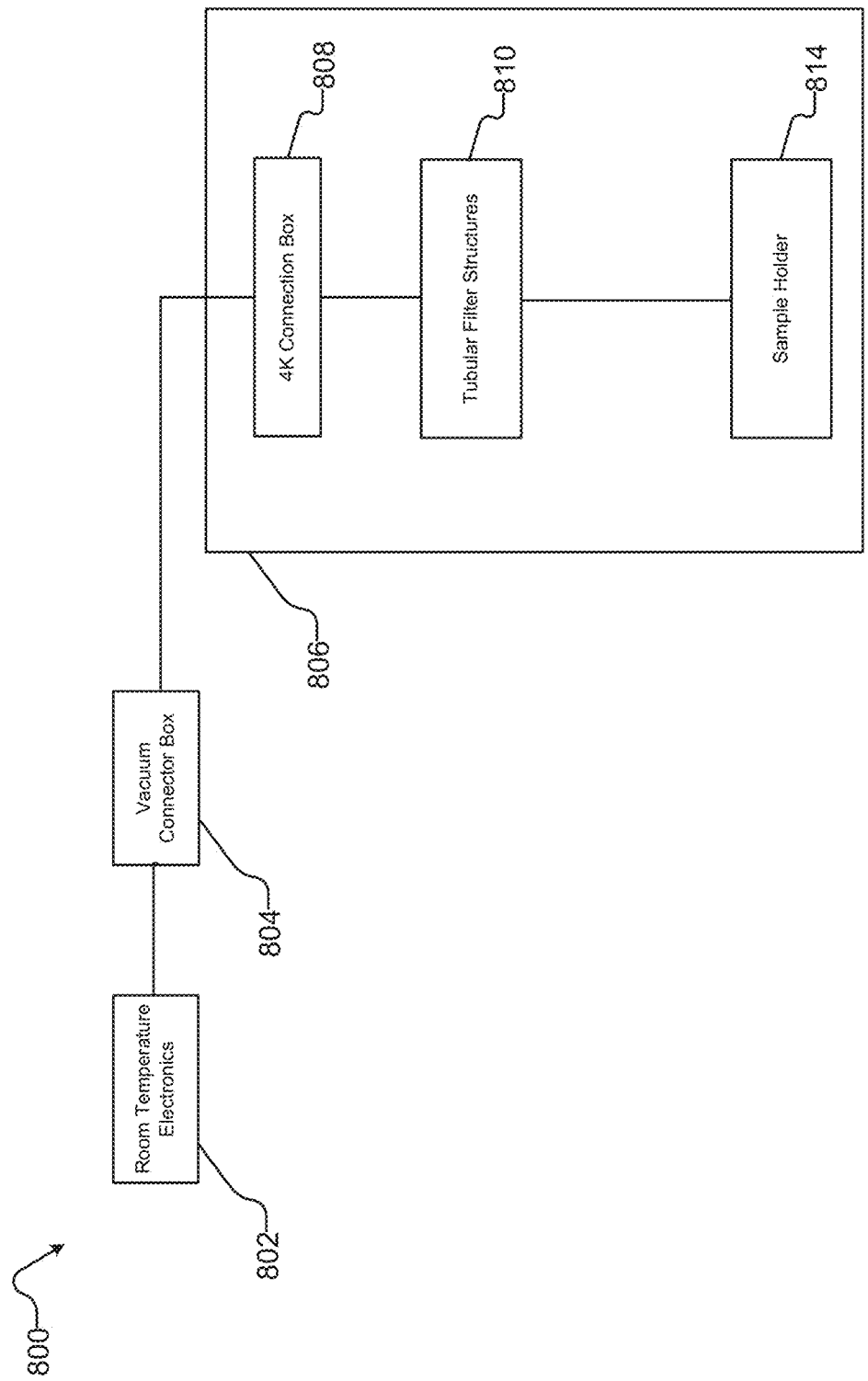
FIG. 8 is schematic diagram of an input/output (I/O) system for use with an integrated circuit in a refrigerated environment.

FIG. 8 shows an input/output (I/O) system 800 for use with an integrated circuit in a refrigerated environment 806 according to one illustrative implementation. An I/O system 800 may interface with a set of room temperature electronics 802, and may include a vacuum connector box 804, and within a refrigerated environment 806 may include an optional 4K connection box 808, tubular filter structures 810, and sample holder 814. Sample holder 814 can include an assembly and pedestal such as assembly 118 and pedestal 104 of FIG. 1, respectively. Superconducting paths are provided within the refrigerated environment 806 and are isolated from heat which can adversely affect performance of the processor and I/O system.

Refrigerated environment 806 may provide milliKelvin temperatures to operate various superconducting components, for example the sample (e.g., superconducting processor or integrated circuit). Refrigerated environment 806 may, for example, take the form of a dilution refrigerator or a pulse tube dilution refrigerator. In some implementations all or part of I/O system 800 may be housed in refrigerated environment 806.

Room temperature electronics 802 may include conventional I/O electronics that are not maintained at superconducting temperatures. Such electronics 802 are not pertinent to the present disclosure so are not discussed further. Signals may be transferred from room temperature electronics 802 to vacuum connector box 804 using, for example, conductive traces carried by PCBs.

Vacuum connector box 804 may provide an interface between room temperature electronics 802 and the portion of I/O system 800 that is in the evacuated refrigerated environment 806. Vacuum connector box 804 may provide a hermetically sealed interface between refrigerated environment 806 and a non-refrigerated environment, while providing electrically conductive signal paths therebetween. Vacuum connector box 804 may include one or more circuit boards, with protecting resistors and coaxial cable.

Optional 4K connection box 808 is where transition may occur between non-superconducting materials and superconducting materials. For example, 4K connection box 808 may be where the transition occurs between non-superconducting coaxial (or shielded twisted-pair, for differential signals) cable and superconducting coaxial (or shielded twisted-pair) cable. In some implementations, the signal lines that input into 4K connector box 808 may be formed by conductive traces carried by printed circuit boards. While designated as 4K, 4K connection box does not have to be at 4K; however, the transition from non-superconducting materials to superconducting materials should occur at a temperature that is below the critical temperature of the superconducting materials. 4K connection box 808 should provide good thermal transfer (i.e., thermalizing) and should have a small volume so as to fit in refrigerated environment 806. In some implementations, a noise filter may be mounted in the connection between the two sets of wires.

Tubular filter structures 810 form the primary filtering stage of I/O system 800. Tubular filter structures 810 may provide low-pass filtering by incorporating lumped element filtering (i.e., using inductors and capacitors) and, in some implementations, high frequency dissipation by incorporating metal powder filtering. In some implementations, at least some the tubular structures used may include differential tubular filter structures.

Sample holder 814 can include a pedestal that provides a mounting platform for an assembly such as assembly 118 in FIG. 1. Sample holder 814 can carry a sample, which may take the form of an integrated circuit or superconducting processor. Sample holder 814 may provide thermal conductivity and electrically superconductive signal paths to the device sample, as well as a stable magnetic environment. Sample holder 814 can include an assembly that may be selectively mounted and dismounted from a pedestal to provide loading and unloading of the device sample from refrigerated environment 806.

It is noted that at least some metal surfaces may be clamped to provide good thermal conductivity and to prevent noise from passing by the various filters. Furthermore, at least some metal surfaces may be lapped and polished to improve thermal contact between surfaces for heat dissipation. In some implementations, the tubular filter structures 810 and sample holder 814 may all be integrated in one I/O support structure.

Certain aspects of the present systems and devices may be realized at room temperature, and certain aspects may be realized at a superconducting temperature. Thus, throughout this specification and the appended claims, the term "superconducting" or "superconductive" when used to describe a physical structure such as a "superconducting wire" or "superconductive material" is used to indicate a material that is capable of behaving as a superconductor at an appropriate temperature. A superconducting material may not necessarily be acting as a superconductor at all times in all embodiments of the present systems and devices.

Some examples of the above described method(s), process(es), or technique(s) method are performed in part by a specialized device such as an adiabatic quantum computer or a quantum annealer or a system to program or otherwise control operation of an adiabatic quantum computer or a quantum annealer, for instance a computer that includes at least one digital processor. The above described method(s), process(es), or technique(s) may include various acts, though those of skill in the art will appreciate that in alternative examples certain acts may be omitted and/or additional acts may be added. Those of skill in the art will appreciate that the illustrated order of the acts is shown for exemplary purposes only and may change in alternative examples. Some of the exemplary acts or operations of the above described method(s), process(es), or technique(s) are performed iteratively. Some acts of the above described method(s), process(es), or technique(s) can be performed during each iteration, after a plurality of iterations, or at the end of all the iterations.

The above description of illustrated implementations, including what is described in the Abstract, is not intended to be exhaustive or to limit the implementations to the precise forms disclosed. Although specific implementations of and examples are described herein for illustrative purposes, various equivalent modifications can be made without departing from the spirit and scope of the disclosure, as will be recognized by those skilled in the relevant art. The teachings provided herein of the various implementations can be applied to other methods of quantum computation, not necessarily the exemplary methods for quantum computation generally described above.

The various implementations described above can be combined to provide further implementations. All of the commonly assigned US patent application publications, US patent applications, foreign patents, and foreign patent applications referred to in this specification and/or listed in the Application Data Sheet are incorporated herein by reference, in their entirety, including but not limited to: U.S. Provisional Patent Application No. 62/727,819 titled "Printed circuit board assembly for edge-coupling to an integrated circuit," Patent Publication No. WO2018/106942 titled "Superconducting printed circuit board related systems, methods, and apparatus," and U.S. Pat. No. 8,441,329 titled "Input/Output systems and devices for use with superconducting based computing systems."

These and other changes can be made to the implementations in light of the above-detailed description. In general, in the following claims, the terms used should not be construed to limit the claims to the specific implementations disclosed in the specification and the claims, but should be construed to include all possible implementations along with the full scope of equivalents to which such claims are entitled. Accordingly, the claims are not limited by the disclosure.

The invention claimed is:

1. A printed circuit board (PCB) assembly for electrically coupling an integrated circuit to coaxial lines, the PCB assembly comprising:
   first PCB having a first surface, a second surface, and a plurality of conductive traces, each one of the plurality of conductive traces having a portion exposed at the second surface of the first PCB;
   a first plurality of coaxial connectors carried by the first surface of the first PCB, each one of the first plurality of coaxial connectors having a respective inner conductor, wherein each one of the plurality of conductive traces is electrically coupled to the inner conductor of a respective one of the first plurality of coaxial connectors;
   a second PCB having a respective first surface and a respective second surface; and
   a second plurality of coaxial connectors carried by the first surface of the second PCB, wherein the first surface of the second PCB is parallel to the first surface of the first PCB.

2. The PCB assembly of claim 1 wherein each conductive trace of the plurality of conductive traces traverses from the first plurality of coaxial connectors towards the second surface of the first PCB.

3. The PCB assembly of claim 1 wherein the first plurality of coaxial connectors includes a plurality of radio frequency connectors.

4. The PCB assembly of claim 1 wherein each conductive trace of the plurality of conductive traces comprises at least one of: aluminum, niobium, tin, and copper.

5. The PCB assembly of claim 1 wherein a distance between the first plurality of coaxial connectors and the second surface of the first PCB is greater than a distance between the second plurality of coaxial connectors and the second surface of the second PCB.

6. The PCB assembly of claim 1 wherein the first PCB includes a third surface, the second PCB includes a third surface, and the third surface of the first PCB is pressed against the third surface of the second PCB.

7. The PCB assembly of claim 6 wherein each one of the first plurality of coaxial connectors faces a first direction and each one of the second plurality of coaxial connectors faces a second direction, and the first direction is different from the second direction.

8. The PCB assembly of claim 1 further comprising a third PCB having a respective first surface orthogonal to the first surface of the first PCB.

* * * * *